(12) United States Patent
Elbanhawy

(10) Patent No.: US 6,930,473 B2
(45) Date of Patent: Aug. 16, 2005

(54) METHOD AND CIRCUIT FOR REDUCING LOSSES IN DC-DC CONVERTERS

(75) Inventor: Alan Elbanhawy, Hollister, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/222,481

(22) Filed: Aug. 16, 2002

(65) Prior Publication Data

US 2003/0038615 A1 Feb. 27, 2003

Related U.S. Application Data

(60) Provisional application No. 60/314,607, filed on Aug. 23, 2001.

(51) Int. Cl.$^7$ .................................................. G05F 1/40
(52) U.S. Cl. ...................................................... 323/282
(58) Field of Search ................................ 323/282, 284, 323/351, 224, 225; 363/39

(56) References Cited

U.S. PATENT DOCUMENTS

| | | |
|---|---|---|
| 3,660,697 A | 5/1972 | Berglund et al. |
| 4,445,202 A | 4/1984 | Goetze et al. |
| 4,454,454 A | 6/1984 | Valentine |
| 4,554,512 A | 11/1985 | Aiello |
| 4,593,213 A | 6/1986 | Vesce et al. |
| 4,616,305 A | 10/1986 | Damiano |
| 4,618,872 A | 10/1986 | Baliga |
| 4,654,769 A | 3/1987 | Middlebrook |
| 4,689,731 A | 8/1987 | Walker et al. |
| 4,725,746 A | 2/1988 | Segawa |
| 4,728,826 A | 3/1988 | Einzinger |
| 4,748,351 A | 5/1988 | Barzegar |
| 4,758,941 A | 7/1988 | Felton et al. |
| 4,760,293 A | 7/1988 | Hebenstreit |
| 4,853,563 A | 8/1989 | Hill et al. |
| 4,866,495 A | 9/1989 | Kinzer |
| 4,882,663 A | 11/1989 | Nilssen |
| 4,888,504 A | 12/1989 | Kinzer |
| 5,023,678 A | 6/1991 | Kinzer |
| 5,124,595 A | 6/1992 | Mandelcorn |
| 5,204,563 A | 4/1993 | Jason |
| 5,227,781 A | 7/1993 | Ninnis |
| 5,264,736 A | 11/1993 | Jacobson |
| 5,323,044 A | 6/1994 | Rumennik et al. |
| 5,332,938 A | 7/1994 | McEwen |
| 5,399,908 A | 3/1995 | Donaldson |
| 5,416,387 A | 5/1995 | Cuk et al. |
| 5,510,747 A | 4/1996 | Williams |
| 5,550,412 A | 8/1996 | Anneser |
| 5,570,276 A | 10/1996 | Cuk et al. |
| 5,616,945 A | 4/1997 | Williams |
| 5,629,542 A | 5/1997 | Sakamoto et al. |
| 5,635,867 A | 6/1997 | Timm |
| 5,689,144 A | 11/1997 | Williams |
| 5,731,732 A | 3/1998 | Williams |
| 5,796,274 A | 8/1998 | Willis et al. |
| 5,909,108 A * | 6/1999 | He et al. ..................... 323/225 |
| 5,973,367 A | 10/1999 | Williams |

(Continued)

*Primary Examiner*—Adolf Berhane
(74) *Attorney, Agent, or Firm*—Townsend and Townsend and Crew LLP

(57) ABSTRACT

In accordance with the present invention, a switching converter includes two transistors Q1 and Q2 parallel-connected between two terminals. Transistor Q1 is optimized to reduce the dynamic loss and transistor Q2 is optimized to reduce the conduction loss. Q1 and Q2 are configured and operated such that the dynamic loss of the converter is dictated substantially by Q1 and the conduction loss of the converter is dictated substantially by Q2. Thus, the tradeoff between these two types of losses present in conventional techniques is eliminated, allowing the dynamic and conduction losses to be independently reduced. Further, the particular configuration and manner of operation of Q1 and Q2 enable reduction of the gate capacitance switching loss when operating under low load current conditions.

58 Claims, 5 Drawing Sheets

U.S. PATENT DOCUMENTS 6,215,288 B1 * 4/2001 Ramsey et al. ............. 323/224
6,249,111 B1 * 6/2001 Nguyen ..................... 323/282
6,310,468 B1 * 10/2001 Feldtkeller ................. 323/282
6,353,309 B1 * 3/2002 Ootani et al. ............... 323/282
6,400,579 B2 * 6/2002 Cuk .......................... 363/16

* cited by examiner

METHOD AND CIRCUIT FOR REDUCING LOSSES IN DC-DC CONVERTERS

CROSS-REFERENCES TO RELATED APPLICATIONS

This application claims priority from U.S. application No. 60/314,607, filed Aug. 23, 2001, entitled "Method and Circuit for Reducing Losses in DC-DC Converters", which disclosure is incorporated by reference.

BACKGROUND OF THE INVENTION

The present invention relates in general to integrated circuits, and in particular to method and circuitry for implementing more efficient DC-DC converters.

One type of DC-DC converter employs transistor switches that are controlled to periodically transfer charge from an input DC voltage supply to a load device across which the output DC voltage is established. Although there are different ways to realize this type of switching conversion, the most common technique uses inductors and capacitors as energy storage elements and one or more MOSFETs as the switching elements.

To increase the efficiency of the converter, attempts are made to minimize the losses in the switching elements (MOSFETs). There are three types of losses in DC-DC converters: (i) conduction loss, (ii) dynamic loss, and (iii) gate capacitance switching loss. Conduction loss is directly proportional to the on-resistance of the switching transistor which in the case of MOSFETs would be the on-resistance across its source and drain (RDSon). Conduction loss is also directly proportional to the load current and the duty cycle of the control signal driving the switching transistor. Dynamic loss is directly proportional to the rise and fall times of the control signal as well as the magnitude of the input DC voltage and load current. Gate capacitance switching loss is directly proportional to the gate charge Qg, switching frequency and gate voltage. For large load currents, the dynamic and conduction losses are far greater in magnitude than the gate capacitance switching loss. However, the gate capacitance switching loss becomes dominant at lower load currents.

For a given input DC voltage, output voltage, and large load current, in order to reduce the conduction loss, it is desirable to reduce RDSon. This is typically accomplished by employing larger or multiple MOSFETs. Larger MOSFETs, however, have larger gate charge Qg leading to slower control signal rise and fall times and therefore larger dynamic loss. Conversely, in order to reduce the dynamic loss, it is desirable to reduce the gate charge Qg which requires smaller MOSFETs which in result in increased RDSon and therefore increased conduction loss. This tradeoff has forced conventional designs to compromise between the two types of losses resulting in a less than optimum design in terms of efficiency. Also, it is desirable to provide a converter which can be controlled to minimize losses for both high and low load currents.

BRIEF SUMMARY OF THE INVENTION

In accordance with the present invention, a switching converter includes two transistors Q1 and Q2 parallel-connected between two terminals. Transistor Q1 is optimized to reduce the dynamic loss and transistor Q2 is optimized to reduce the conduction loss. Q1 and Q2 are configured and operated such that the dynamic loss of the converter is dictated substantially by Q1 and the conduction loss of the converter is dictated substantially by Q2. Thus, the tradeoff between these two types of losses present in conventional techniques is eliminated, allowing the dynamic and conduction losses to be independently reduced. Further, the particular configuration and manner of operation of Q1 and Q2 enable reduction of the gate capacitance switching loss when operating under low load current conditions.

In one embodiment, a circuit includes a first switch and a controller block coupled to the first switch. The first switch includes first and second transistors which are parallel-connected between first and second terminals. The second transistor is larger in size than the first transistor. If a first current to be transferred through the first switch is greater than a predetermined amount, then the controller block operates to turn on the first switch by: (i) turning on the first transistor so that a voltage level at the second terminal starts moving towards a predetermined voltage level at the first terminal, and (ii) turning on the second transistor after the voltage level at the first terminal reaches a voltage level substantially equal to the predetermined voltage level.

In another embodiment, after the second transistor is turned on a substantial portion of the first current is transferred through the second transistor.

In another embodiment, if the first current is less than the predetermined amount, the controller block turns on the first switch by turning on the first transistor and maintaining the second transistor in the off state so that the first current is transferred only through the first transistor.

In another embodiment, the first transistor has a lower gate capacitance than the second transistor, and the second transistor has a lower on-resistance than the first transistor.

In another embodiment, if the first current is greater than the predetermined amount, the controller block operates to turn off the switch by: (i) initially turning off the second transistor so that the first current is transferred only through the first transistor, and (ii) then turning off the first transistor so that no current can be transferred through the first switch.

In another embodiment, the first terminal is coupled to an input source and the second terminal is coupled to an output load, and the circuit further includes a second switch having third and fourth transistors parallel-connected between the output load and a reference source. The controller block is coupled to the second switch so that when the first switch is on the second switch is off and vice versa.

In another embodiment, the third transistor is smaller in size than the fourth transistor, and if the first current is greater than the predetermined amount, the controller block turns on the second switch by: (i) initially turning on the third transistor so that a voltage level at the output load lowers towards a reference potential at the reference source, and (ii) then turning on the fourth transistor after the voltage level at the output load reaches a voltage level substantially equal to the reference potential.

In another embodiment, if the first current is less than the predetermined amount, the controller block turns on the second switch by only turning on the third transistor and maintaining the fourth transistor in the off state.

In another embodiment, the third transistor has a lower gate capacitance than the fourth transistor and the fourth transistor has a lower on-resistance than the third transistor.

In accordance with another embodiment, a converter circuit includes a first switch which in turn includes first and second transistors parallel-connected between first and second terminals. The first transistor is smaller in size than the second transistor. A method of operating the converter circuit is as follows. The first switch is turned off in a first cycle, and turned on in a second cycle. During a transition from the first cycle to the second cycle, the first transistor is turned on so that a voltage level at the second terminal starts moving towards a predetermined voltage level at the first terminal. If a first current to be transferred through the first switch is greater than a predetermined amount, the second transistor is turned on after the voltage level at the first terminal reaches a voltage level substantially equal to the predetermined voltage level.

In another embodiment, upon turning on the first transistor the first transistor transfers the first current from the first terminal to the second terminal, and upon turning on the second transistor the second transistor transfers a substantial portion of the first current from the first terminal to the second terminal for the duration of the second cycle.

In another embodiment, the first switch is turned off in a third cycle, and during a transition from the second cycle to the third cycle: (i) the second transistor is turned off so that the first current is transferred to the second terminal only through the first transistor, and (ii) after a predetermined time-delay from turning off the second transistor, the first transistor is turned off so that no current is transferred through the first switch.

In another embodiment, if the first current is less than the predetermined amount, the second transistor is kept off for the duration of the second cycle.

In another embodiment, the first transistor has a lower gate capacitance than the second transistor, and the second transistor has a lower on-resistance than the first transistor.

In another embodiment, the converter circuit further includes a second switch. In the first cycle, the first switch is turned off and the second switch is turned on, and in the second cycle, the first switch is tuned on and the second switch is turned off.

In another embodiment, the first terminal is coupled to an input source and the second terminal is coupled to an output load. The second switch has third and fourth transistors parallel-connected between the output load and a reference source. The third transistor is smaller in size than the fourth transistor. During the transition from the first cycle to the second cycle, the second switch is turned off by: (i) turning off the fourth transistor; and (ii) after a predetermined time-delay from turning off the fourth transistor, turning off the third transistor so that no current is transferred through the second switch.

In another embodiment, the third transistor has a lower gate capacitance than the fourth transistor and the fourth transistor has a lower on-resistance than the third transistor.

The following detailed description and the accompanying drawings provide a better understanding of the nature and advantages of the present invention.

BRIEF DESCRIPTION OF THE DRAWINGS

FIG. 1b shows a timing diagram used to describe the operation of the switching converter shown in FIG. 1a;

FIG. 2b shows a timing diagram used to describe the operation of the switching converter shown in FIG. 2a.

DETAILED DESCRIPTION OF THE INVENTION

In accordance with the present invention, a method and circuitry for implementing switching converters that improve switching efficiency by reducing the conduction loss, the dynamic loss, and the gate capacitance switching loss are provided. The switching converter includes two transistors Q1 and Q2 parallel-connected between two terminals. Transistor Q1 is optimized to reduce the dynamic loss and transistor Q2 is optimized to reduce the conduction loss. Q1 and Q2 are configured and operated such that the dynamic loss of the converter is dictated substantially by Q1 and the conduction loss of the converter is dictated substantially by Q2. Thus, the tradeoff between these two types of losses present in conventional techniques is eliminated, allowing the dynamic and conduction losses to be independently reduced. Further, the particular configuration and manner of operation of Q1 and Q2 enable reduction of the gate capacitance switching loss when operating under low load current conditions.

In one embodiment, transistor Q1 is made relatively small with a small Qg and is controlled to supply the load current during the switching periods. Transistor Q2 is made larger than Q1 and is controlled to be off during the switching periods but is turned on to supply a substantial portion of the load current during the on-cycles. In this fashion, by only switching the smaller gate charge of Q1 during the switching periods, faster control signal rise and fall times and thus a lower dynamic loss is achieved. At the same time, with the relatively large size of Q2, a low on-resistance and thus low conduction loss is achieved for the duration that the switch is on. When operating under low load current conditions, the high conduction capability of the large transistor Q2 is not needed, and thus is kept off at all times. In this manner, only the small gate charge of Q1 (rather than the gate charge of both Q1 and Q2) is switched in every cycle. Thus, the gate capacitance switching loss is reduced under low load current conditions. Accordingly, the converter's dynamic losses, conduction losses, and gate capacitance switching losses are independently reduced without one adversely impacting the other, and thus the efficiency of the converter is significantly improved.

Figure 1A:
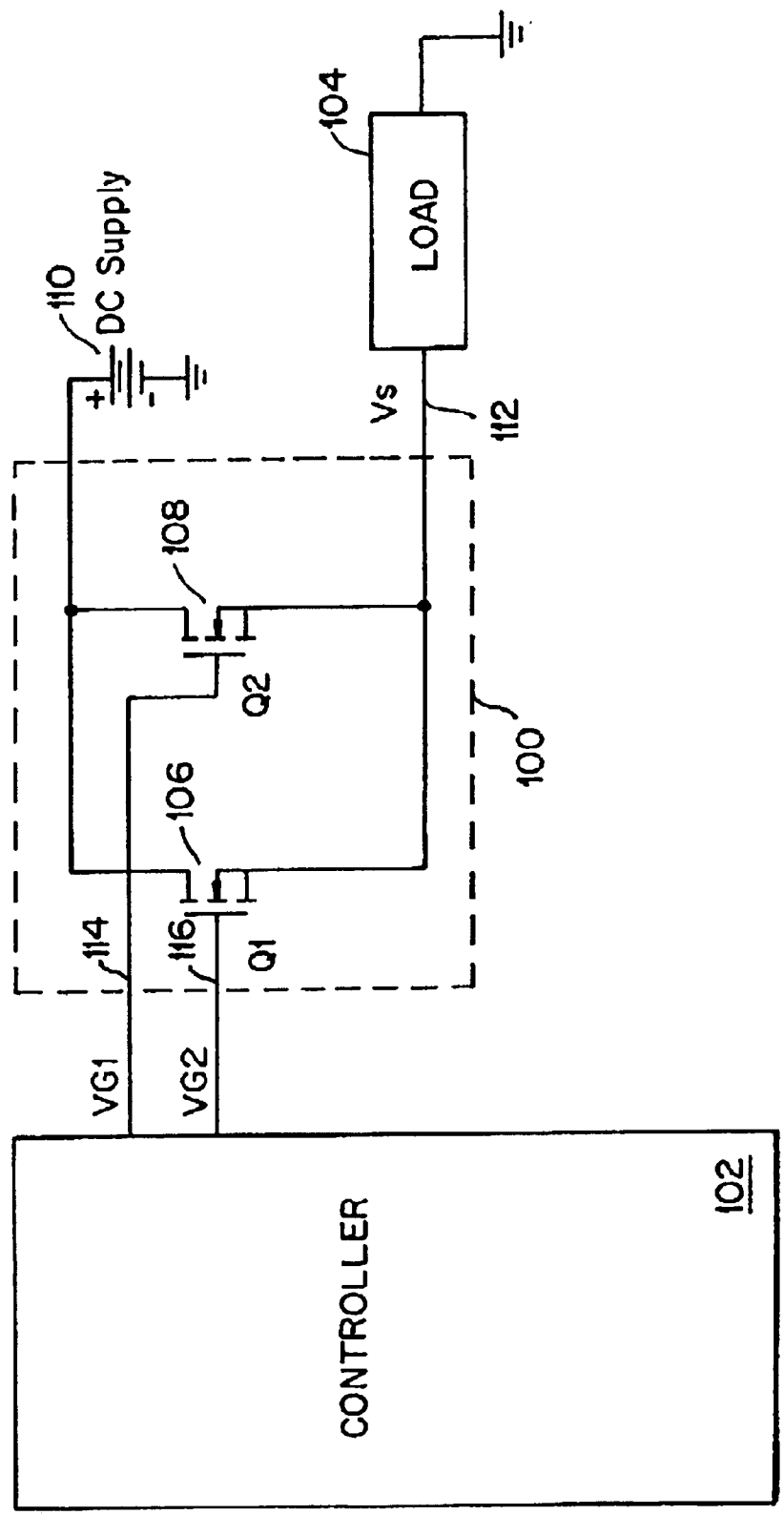
FIG. 1a shows a simplified implementation for a switching converter in accordance with an exemplary embodiment of the invention.

FIG. 1a illustrates a simplified implementation for a switching converter 100 in accordance with an exemplary embodiment of the invention. Switch 100 includes a pair of parallel-connected switching MOSFETs Q1 and Q2 coupled between an input source 110 and an output load 104. Q2 is larger in size (i.e., has lower on-resistance) than Q1. In one embodiment, Q2 is several times larger than Q1. A controller block 102 separately drives the gates of transistors Q1 and Q2. The operation of switch 100 is described next using the timing diagram shown in FIG. 1b.

Figure 1B:
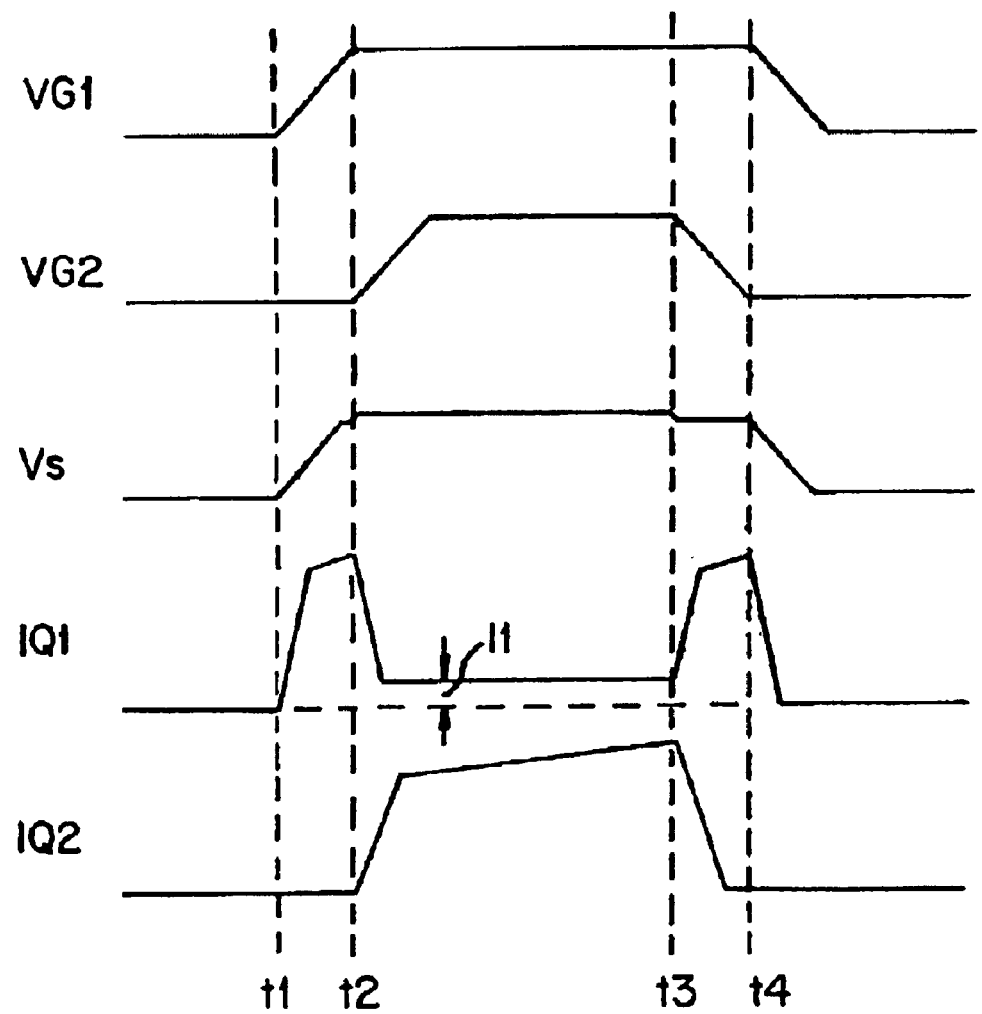

In FIG. 1b, the on-cycle (i.e., the cycle during which switch 100 is on) is used to describe the operation of switch 100. Prior to time t1, switch 100 is off and switching signal Vs at node 112 is at a low reference potential. At time t1, controller block 102 turns Q1 on by raising Q1's gate voltage VG1 high. This starts the process of charge transfer from input source 110 to output load 104. After a time delay, at time t2, controller block 102 turns on transistor Q2 by raising Q2's gate voltage VG2 high. Voltage signals VG1 and VG2 are timed so that the larger transistor Q2 is turned on after the output voltage Vs reaches a level substantially equal to the voltage supplied by input source 110. In this manner, by the time Q2 is turned on, the switching has, for the most part, been completed by Q1. Thus, little to no dynamic loss occurs in Q2 when it is turned on at time t2. In FIG. 1b, the small step in Vs at time t2 reflects the reduction in the voltage drop across switch 100 due to Q2 (with its much lower on-resistance) turning on.

As shown by the current waveforms IQ1 (the transient current through Q1) and IQ2 (the transient current through Q2) in FIG. 1b, between times t1 and t2 when only Q1 is on, Q1 supplies the load current to load 104. After time t2, when both Q1 and Q2 are on, because Q2 is a larger transistor with a lower on-resistance than Q1, a substantial amount of the load current is supplied by Q2. Only a small fraction of the load current (shown in FIG. 1b as I1) is supplied by Q1. Thus, the converter conduction loss occurs primarily in Q2.

At the end of the duty cycle when switch 100 is to be turned off, controller block 102 first turns Q2 off by lowering its gate voltage VG2 at time t3. Q2 thus stops supplying the load current to load 104. However, transistor Q1 is still on at this time and thus starts supplying the load current to the load as soon as transistor Q2 turns off. As shown by the Vs waveform, at time t3 when the load current switches from flowing through Q2 to Q1, Vs drops a small amount reflecting the higher on-resistance of Q1. At time t4, Q1 is also turned off and thus the load current is switched off. With both Q1 and Q2 in the off state, a low-side switch (not shown) pulls Vs to a low reference potential. Thus, at the end of the duty cycle, as at the beginning of the duty cycle, the switching loss occurs primarily in Q1.

In one embodiment of the invention, shown in FIG. 1A, a method using a direct assay format is provided to detect the free form of the first member 1BP of a binding pair BP comprising a first 1BP and second member 2BP. In step 1 of the method, a first particle 1p bound to the second member 2BP is provided in a suitable reaction buffer at a concentration of between about $5 \times 10^{10}$ and $1 \times 10^{13}$ particles per ml. The particle solution is contacted with an aliquot of sample (e.g., human plasma or other body fluids or fluid samples), which is preferably about ½0 the volume of particle solution forming a reacted sample.

Another advantageous aspect of the present invention is that it allows for realizing much higher efficiencies at very low to moderately low load current conditions where the converter losses are dominated primarily by the gate capacitance switching. The gate capacitance switching loss is approximated as:

$Qg \times$ Gate Voltage$\times$Switching Frequency

In the second step, as shown in FIG. 1B, a second particle solution comprising second particles 2p bound to a third member 3BP at a concentration of about $5 \times 10^{11}$ and $1 \times 10^{14}$ particles per ml is contacted with the reacted sample for a period sufficient to allow agglutination, preferably between about 2–5 minutes. The third member 3BP is capable of binding to the first member 1BP but is different from the second member 2BP; i.e., it binds at a different, single binding site on the first member. The second particle 2p itself may be the same as, or different from, the first particle 1p. The third member 3BP bound to the second particle 2p will bind to any first complex 1c, forming a second complex 2c illustrated in FIG. 1C. The third member 3BP will also bind to any remaining free first member 1BP in solution and to first member 1BP bound to second member 2BP (see complex 3c in FIG. 1). However, only formation of the second complex 2c and the formation of a bridge between first and second particle, 1p and 2p, will be detectable as an agglutination reaction, measurable as a change in turbidity of the sample.

In one embodiment, MOSFETs Q1 and Q2 are formed on a single integrated circuit power device having a drain terminal coupled to the drains of Q1 and Q2, a source terminal coupled to the sources of Q1 and Q2, and two gate terminals coupled to the respective gates of Q1 and Q2. In an alternate embodiment, Q1 and Q2 are formed as discrete power MOSFET components. The former integrated embodiment yields lower parasitic conductances, lower PCB footprint, and lower device cost.

FIG. 1a shows implementation of the present invention in a high-side switch. A low-side switch implementation, or implementation of the present invention in any DC-DC converter having one or more MOSFET switch(es), would be obvious to one skilled in the art in view of this disclosure.

Figure 2A:
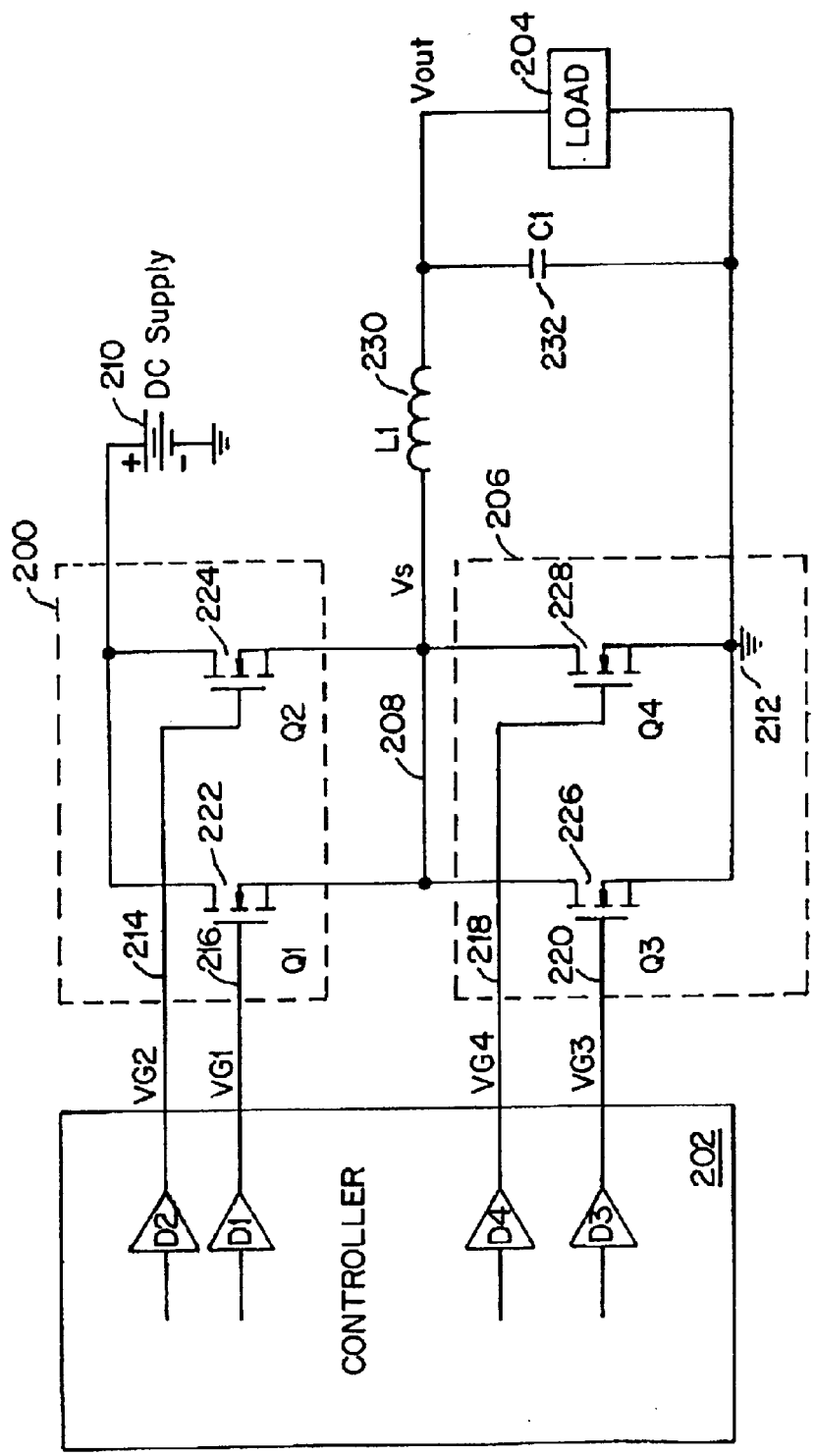
FIG. 2a shows a switching converter commonly known as synchronous Buck converter which has been modified in accordance with the present invention to improve its efficiency.

FIG. 2a shows a switching converter commonly known as synchronous Buck converter which has been modified to improve its efficiency in accordance with the invention. Other types of DC-DC converters can be similarly modified to improve their efficiency. The converter in FIG. 2a includes a high-side switch 200 and a low-side switch 206 serially-connected between an input source 210 and a reference source 212. High-side switch 200 includes a pair of MOSFETs Q1 and Q2 which are parallel-connected between input source 210 and intermediate node Vs 208 in a similar manner to Q1 and Q2 in switch 100 in FIG. 1a. Driver D1 is coupled to drive the gate of Q1, and driver D2 is coupled to drive the gate of Q2. Low-side switch 206 includes a pair of MOSFETs Q3 and Q4 parallel-connected between intermediate node Vs 208 and a reference source 212. In one embodiment, reference source 212 is the ground potential. Driver D3 is coupled to drive the gate of Q3, and driver D4 is coupled to drive the gate of Q4. Intermediate node Vs is coupled to load 204 through a LC filter commonly used in Buck converters.

Figure 2B:
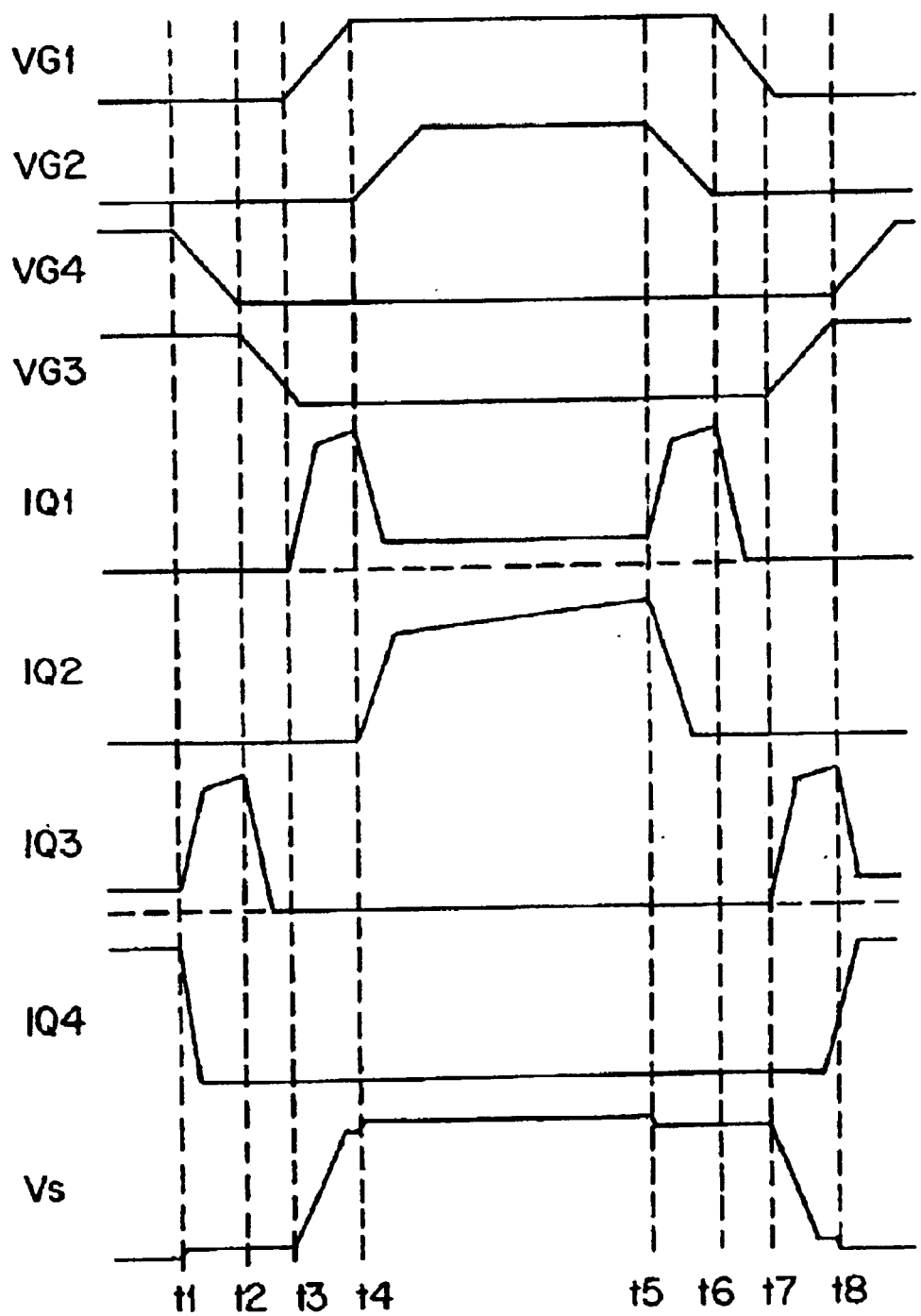

The same technique described above is used in each of the high-side switch 200 and low-side switch 206 to minimize the overall converter losses. In high-side switch 200, Q1 is smaller in size than Q2, and in low-side switch 206, Q3 is smaller in size than Q4. The smaller Q1 and Q3 are optimized to reduce the switching losses, while the larger Q2 and Q4 are optimized to reduce the conduction losses. The operation of the converter in FIG. 2a is described using FIG. 2b.

Once again, the on-cycle is used to describe the operation of the converter in FIG. 2a. At the beginning of the duty cycle, prior to time t1, Q1 and Q2 are off while Q3 and Q4 are on. Thus, Vs is substantially equal to the potential at reference source 212. Since Q4 is larger than Q3, Q4 sources a far greater portion of the load current than Q3. At time t1, driver D4 turns off Q4, and then at time t2, driver D3 turns off Q3. Thus, between t1 and t2, with Q4 off, Q3 sources the load current. Vs is shown to slightly increase at t1 reflecting the higher on-resistance of Q3. Thus at time t2, with Q4 previously turned off, only Q3 operates to switch off the load current, and thus the switching loss is dictated primarily by the smaller Q3.

At time t3, driver D1 turns on Q1, and then at time t4 driver D2 turns on Q2. Q1 and Q2 operate in the same manner describe above in connection with switch 100 in FIG. 1a, and thus the same efficiencies as in FIG. 1a are achieved. The time delay between t2 and t3 is included to ensure that no cross conductance occurs (i.e., no current flows from Input source 210 to reference source 212 through the two switches) during the transition from turning off low-side switch 206 to turning on high-side switch 200.

During the time between t4 and t5 (the conduction or non-switching period of the duty cycle) the load current is supplied to load 204 primarily through Q2 as described above. With Q2's low on-resistance, the conduction loss of switch 200 is substantially reduced. At the end of the on-cycle, just prior to time t5, Q1 and Q2 are on while Q3 and Q4 are off. Thus, Vs is substantially equal the supply voltage provided by input source 210 at this time. At time t5, driver D2 turns off Q2, and then at time t6, driver D1 turns off Q1. As described above in connection with FIG. 1a, this results in low switching loss since only Q1 acts to switch the load current off.

At time t7, driver D3 turns Q3 on, and then at time t8, driver D4 turns Q4 on. In this manner, initially Q3 is used to source the load current to lower Vs, and then later Q4 is turned on to sustain the load current during the off-cycle. Once again, the switching loss is controlled by the smaller size Q3, and the conduction loss is controlled by the larger size Q4. The time delay between t6 and t7 is included to ensure that no cross-conductance occurs (i.e., no current flows from input source 110 to reference source 212 through the two switches) during the transition from turning off high-side switch 200 to turning on low-side switch 206.

In one embodiment, MOSFETs Q1, Q2, Q3, and Q4 are formed on a single integrated circuit power device having an input terminal coupled to receive the input source, a reference terminal coupled to receive the reference source, an output terminal coupled to drive a load, and four gate terminals each coupled to receive signals from a respective one of four drivers. In an alternate embodiment, MOSFETs Q1, Q2, Q3, and Q4 are formed as four discrete integrated circuit components interconnected as shown in FIG. 2a to form a DC-DC converter. In yet another embodiment, Q1 and Q2 are formed on one integrated circuit and Q3 and Q4 are formed on a second integrated circuit.

Other implementations of the Buck converter are also possible. For example, low-side switch 206 may be modified to have only one MOSFET rather than two, or alternatively, high-side switch 200 may be modified to have only one MOSFET rather than two. These implementations may be useful in applications where it is desirable to obtain lower area consumption at the expense of some loss in efficiency.

Figure 3A:
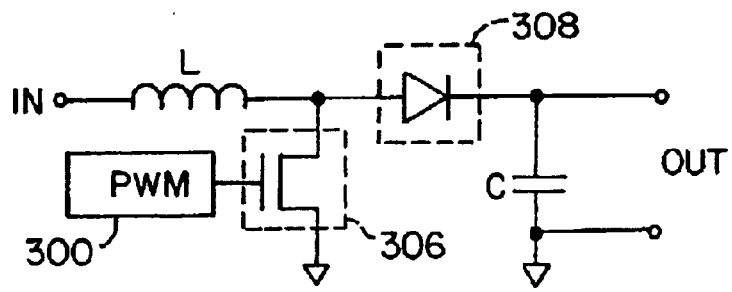
FIGS. 3a, 3b, and 3c show three of many different types of DC-DC converters, and are provided to illustrate how different types of converters can be modified in accordance with the invention to improve their efficiency.
Figure 3B:
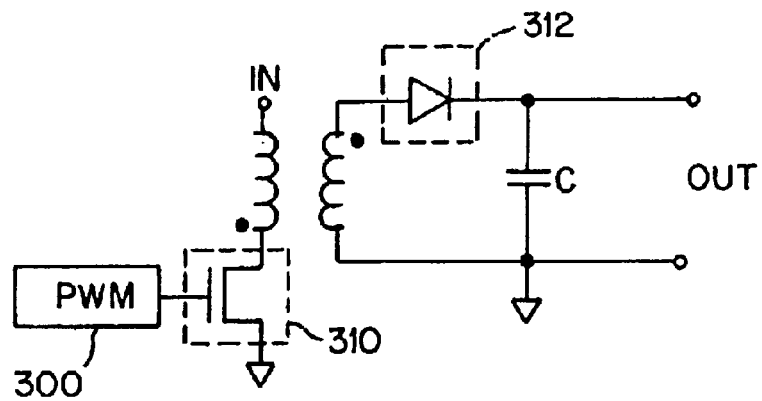
Figure 3C:
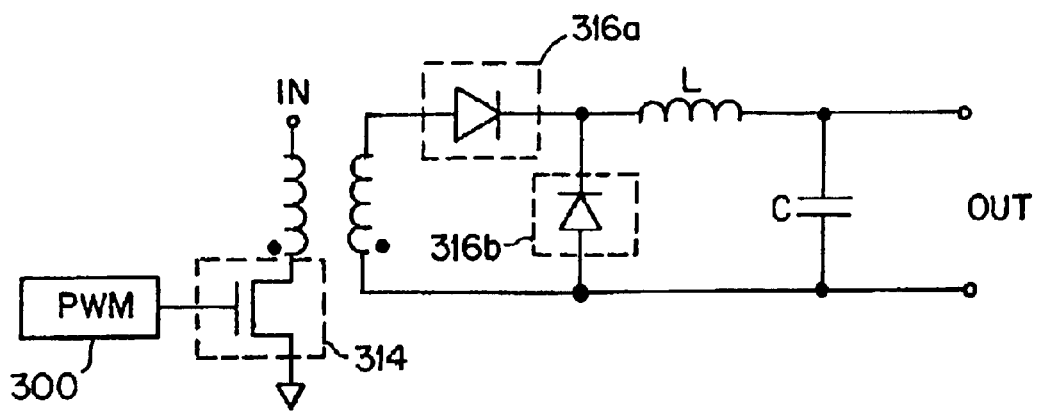

Although the invention has been described using a particular type of DC-DC converter (i.e., Buck converter), the invention is not limited as such. One skilled in the art can modify other types of converters to substantially improve their efficiency in view of this disclosure. Three examples of different types of converters which can be modified to improve their efficiency are shown in FIGS. 3a–3c. FIG. 3a shows a Boost converter. Here, switch 306 can be replaced with a pair of parallel-connected MOSFETs Q1 and Q2. Diode 308 may similarly be replaced with a pair of parallel-connected MOSFETs Q3 and Q4, the gates of which would be controlled by PWM 300. In this case, Q1 and Q2 are sized and function similar to Q1 and Q2 in FIG. 2a, and Q3 and Q4 are sized and function similar to Q3 and Q4 in FIG. 2a.

FIG. 3b shows a Flyback converter. Here, switch 310 may be replaced with a pair of parallel-connected MOSFETs Q1 and Q2. Diode 312 may similarly be replaced with a pair of parallel-connected MOSFETS Q3 and Q4, the gates of which would be controlled by PWM 300. In this case, Q1 and Q2 are sized and function similar to Q1 and Q2 in FIG. 2a, and Q3 and Q4 are sized and function similar to Q3 and Q4 in FIG. 2a.

FIG. 3c shows a Forward converter. Here, switch 314 may be replaced with a pair of parallel-connected MOSFETs Q1 and Q2. Diode 316a may similarly be replaced with a pair of parallel-connected MOSFETS Q3 and Q4, the gates of which would be controlled by PWM 300. Further, diode 316b may be replaced with a pair of parallel-connected MOSFETs Q5 and Q6, the gates of which would be controlled by PWM 300. In this case, Q1 and Q3 correspond to Q1 in FIG. 2a in terms of size and function, and Q2 and Q4 correspond to Q2 in FIG. 2a in terms of size and function. However, a separate driver must be used for each of Q1 and Q3, and similarly, a separate driver must be used for each of Q2 and Q4. Q5 and Q6 are sized and function in a similar manner to Q3 and Q4 in FIG. 2a.

Many other types of converters can similarly be modified to improve their efficiency.

While the above is a complete description of the embodiments of the present invention, it is possible to use various alternatives, modifications and equivalents. For example, although the invention is describe using MOSFET technology, implementing the invention in other types of technologies such as bipolar or gallium-arsenide would be obvious to one skilled in the art in view of this disclosure. Therefore, the scope of the present invention should be determined not with reference to the above description but should, instead, be determined with reference to the appended claim, along with their full scope of equivalents.

What is claimed is:

1. A circuit comprising:
    a first switch having first and second transistors being parallel-connected between first and second terminals, the second transistor being larger in size than the first transistor; and
    a controller block coupled to the first switch such that:
        if a first current to be transferred through the first switch is greater than a predetermined amount the controller block turns on the first switch by: (i) turning on the first transistor so that a voltage level at the second terminal starts moving towards a predetermined voltage level at the first terminal, and (ii) turning on the second transistor after the voltage level at the second terminal reaches a voltage level substantially equal to the predetermined voltage level, and
        if the first current is less than the predetermined amount, the controller block turns on the first switch by turning on the first transistor and maintaining the second transistor in the off state so that the first current is transferred only through the first transistor.

2. The circuit of claim 1 wherein in the case of the first current being greater than the predetermined amount, after the second transistor is turned on a substantial portion of the first current is transferred through the second transistor.

3. The circuit of claim 1 wherein the first transistor has a lower gate capacitance than the second transistor, and the second transistor has a lower on-resistance than the first transistor.

4. The circuit of claim 1 wherein in the case of the first current being greater than the predetermined amount, the controller block turns off the first switch by: (i) initially turning off the second transistor so that the first current is transferred only through the first transistor, and (ii) then turning off the first transistor so that no current can be transferred through the first switch.

5. The circuit of claim 1 wherein the controller block comprises:
    a first driver coupled to control the first transistor; and
    a second driver coupled to control the second transistor.

6. The circuit of claim 1 wherein the first and second transistors are discrete integrated circuit components.

7. The circuit of claim 1 wherein the first and second transistors are formed in an integrated circuit power device having a drain terminal, a source terminal, and two gate terminals, the source terminal being coupled to the sources of the first and second transistors, the drain terminal being coupled to the drains of the first and second transistors, and each of the two gate terminals being couple to a respective gate of the first and second transistors.

8. The circuit of claim 1 wherein the circuit is a DC-DC converter.

9. The circuit of claim 1 wherein the first terminal is coupled to an input source and the second terminal is coupled to an output load, the circuit further comprising a second switch having third and fourth transistors parallel-connected between the output load and a reference source, the controller block being coupled to the second switch so that when the first switch is on the second switch is off and vice versa.

10. The circuit of claim 9 wherein the third transistor is smaller in size than the fourth transistor, and if the first current is greater than the predetermined amount, the controller block turns on the second switch by: (i) initially turning on the third transistor so that a voltage level at the output load lowers towards a reference potential at the reference source, and (ii) then turning on the fourth transistor after the voltage level at the output load reaches a voltage level substantially equal to the reference potential.

11. The circuit of claim 10 wherein if the first current is less than the predetermined amount, the controller block turns on the second switch by only turning on the third transistor and maintaining the fourth transistor in the off state.

12. The circuit of claim 9 wherein the third transistor has a lower gate capacitance than the fourth transistor and the fourth transistor has a lower on-resistance than the third transistor.

13. The circuit of claim 9 wherein the first, second, third, and fourth transistors are discrete integrated circuit components.

14. The circuit of claim 9 wherein the first and second transistors are formed in a first integrated circuit power device, and the third and fourth transistors are formed in a second integrated circuit power device, each of the first and second integrated power devices having a drain terminal, a source terminal, and two gate terminals.

15. The circuit of claim 9 wherein the first, second, third, and fourth transistors are formed in one integrated circuit power device having a first terminal configured to receive the input source, a second terminal configured to receive the reference source, a third terminal coupled to the output load, and four gate terminals each configured to receive a separate drive signal from the controller block.

16. The circuit of claim 9 wherein the controller block further comprises:
 a first driver coupled to control the first transistor;
 a second driver coupled to control the second transistor;
 a third driver coupled to control the third transistor; and
 a fourth driver coupled to control the fourth transistor.

17. A converter circuit comprising:
 a first switch having first and second transistors parallel-connected between first and second terminals, the first transistor being smaller in size than the second transistor; and
 a controller block coupled to maintain the first switch in an off-state during a first cycle and to maintain the first switch in an on-state during a second cycle, wherein during a transition from the first cycle to the second cycle:
  if a first current to be transferred through the first switch is greater than a predetermined amount the controller block maintains the second transistor in the off state but turns the first transistor on so that a voltage level at the second terminal starts moving towards a predetermined voltage level at the first terminal, and when the voltage level at the second terminal reaches a voltage level substantially equal to the predetermined voltage level the controller block turns on the second transistor, and
  if the first current is less than the predetermined amount, the controller block turns on the first transistor, and keeps the second transistor off for the duration of the second cycle.

18. The converter circuit of claim 17 wherein in the case of the first current being greater than the predetermined amount, during the transition when only the first transistor is on the first transistor transfers the first current from the first terminal to the second terminal, and when the second transistor is turned on the second transistor transfers a substantial portion of the first current from the first terminal to the second terminal for the duration of the second cycle.

19. The converter circuit of claim 18 wherein the controller block turns off the first switch in a third cycle, and if the first current is greater than the predetermined amount, then during a transition from the second cycle to the third cycle the controller block: (i) turns off the second transistor so that the first current is transferred to the second terminal only through the first transistor, and (ii) after a predetermined time-delay from turning off the second transistor, turns off the first transistor so that no current is transferred through the first switch.

20. The converter circuit of claim 17 wherein the first transistor has a lower gate capacitance than the second transistor, and the second transistor has a lower on-resistance than the first transistor.

21. The converter circuit of claim 17 wherein the controller block further comprises:
 a first driver coupled to control the first transistor; and
 a second driver coupled to control the second transistor.

22. The converter circuit of claim 11 the first and second transistors are discrete integrated circuit components.

23. The converter circuit of claim 17 wherein the first and second transistors are formed in an integrated circuit power device having a drain terminal, a source terminal, and two gate terminals, the source terminal being coupled to the sources of the first and second transistors, the drain terminal being coupled to the drains of the first and second transistors, and each of the two gate terminals being couple to a respective gate of the first and second transistors.

24. The converter circuit of claim 17 wherein the converter circuit is a DC-DC converter.

25. The converter circuit of claim 17 further comprising a second switch coupled to the controller block, wherein the controller block turns off the first switch and turns on the second switch in the first cycle, and turns on the first switch and turns off the second switch in the second cycle.

26. The converter circuit of claim 25 wherein the first terminal is coupled to an input source and the second terminal is coupled to an output load, the second switch having third and fourth transistors parallel-connected between the output load and a reference source.

27. The converter circuit of claim 26 wherein the third transistor is smaller in size than the fourth transistor, and in the case of the first current being greater than the predetermined amount, during the transition from the first cycle to the second cycle the controller block turns off the second switch by: (i) turning off the fourth transistor, and (ii) after a predetermined time-delay from turning off the fourth transistor, turning off the third transistor so that no current is transferred through the second switch.

28. The converter circuit of claim 26 wherein the third transistor has a lower gate capacitance than the fourth transistor and the fourth transistor has a lower on-resistance than the third transistor.

29. The converter circuit of claim 26 wherein the first, second, third, and fourth transistors are discrete integrated circuit components.

30. The converter circuit of claim 26 wherein the first and second transistors are formed in a first integrated circuit power device, and the third and fourth transistors are formed in a second integrated circuit power device, each of the first and second integrated power devices having a drain terminal, a source terminal, and two gate terminals.

31. The converter circuit of claim 26 wherein the first, second, third, and fourth transistors are formed in one integrated circuit power device having a first terminal configured to receive the input source, a second terminal configured to receive the reference source, a third terminal coupled to the output load, and four gate terminals each configured to receive a separate drive signal from the controller block.

32. The converter circuit of claim 26 wherein the controller block further comprises:
a first driver coupled to control the first transistor;
a second driver coupled to control the second transistor;
a third driver coupled to control the third transistor; and
a fourth driver coupled to control the fourth transistor.

33. A method of operating a converter circuit having a first switch which includes first and second transistors parallel-connected between first and second terminals, the first transistor being smaller in size than the second transistor, the method comprising:
turning off the first switch in a first cycle;
turning on the first switch in a second cycle;
during a transition from the first cycle to the second cycle, turning on the first transistor so that a voltage level at the second terminal starts moving towards a predetermined voltage level at the first terminal;
if a first current to be transferred through the first switch is greater than a predetermined amount, turning on the second transistor after the voltage level at the second terminal reaches a voltage level substantially equal to the predetermined voltage level; and
if the first current is less than the predetermined amount, maintaining the second transistor off for the duration of the second cycle.

34. The method of claim 33 wherein upon turning on the first transistor the first transistor transfers the first current from the first terminal to the second terminal, and in the act of turning on the second transistor the second transistor transfers a substantial portion of the first current from the first terminal to the second terminal for the duration of the second cycle.

35. The method of claim 34 further comprising:
turning off the first switch in a third cycle; and
in the case of the first current being greater than the predetermined amount, during a transition from the second cycle to the third cycle:
turning off the second transistor so that the first current is transferred to the second terminal only through the first transistor; and
after a predetermined time-delay from turning off the second transistor, turning off the first transistor so that no current is transferred through the first switch.

36. The method of claim 33 wherein the first transistor has a lower gate capacitance than the second transistor, and the second transistor has a lower on-resistance than the first transistor.

37. The method of claim 33 wherein the converter circuit is a DC-DC converter.

38. The method of claim 33 wherein the converter circuit further includes a second switch, the method further comprising:
in the first cycle, turning off the first switch and turning on the second switch; and
in the second cycle, turning on the first switch and turning off the second switch.

39. The method of claim 38 wherein the first terminal is coupled to an input source and the second terminal is coupled to an output load, the second switch having third and fourth transistors parallel-connected between the output load and a reference source, the third transistor being smaller in size than the fourth transistor, the method further comprising:
in the case of the first current being greater than the predetermined amount, during the transition from the first cycle to the second cycle, turning off the second switch by:
turning off the fourth transistor; and
after a predetermined time-delay from turning off the fourth transistor, turning off the third transistor so that no current is transferred through the second switch.

40. The method of claim 39 wherein the third transistor has a lower gate capacitance than the fourth transistor and the fourth transistor has a lower on-resistance than the third transistor.

41. A circuit comprising:
a first switch having first and second transistors parallel-connected between first and second terminals, the first terminal being coupled to an input source and the second terminal being coupled to an output load, the second transistor being larger in size than the first transistor;
a second switch having third and fourth transistors parallel-connected between the output load and a reference source; and
a controller block coupled to control the first and second switches such that when the first switch is on the second switch is off and vice versa, wherein the controller block turns on the first switch by: (i) turning on the first transistor so that a voltage level at the second terminal starts moving towards a predetermined voltage level at the first terminal, and (ii) turning on the second transistor after the voltage level at the second terminal reaches a voltage level substantially equal to the predetermined voltage level.

42. The circuit of claim 41 wherein after the second transistor is turned on a substantial portion of the first current is transferred through the second transistor.

43. The circuit of claim 41 wherein the controller block turns off the first switch by: (i) initially turning off the second transistor so that the first current is transferred only through the first transistor, and (ii) then turning off the first transistor so that no current can be transferred through the first switch.

44. The circuit of claim 41 wherein the third transistor is smaller in size than the fourth transistor, and the controller block turns on the second switch by: (i) initially turning on the third transistor so that a voltage level at the output load lowers towards a reference potential at the reference source, and (ii) then turning on the fourth transistor after the voltage level at the output load reaches a voltage level substantially equal to the reference potential.

45. The circuit of claim 44 wherein:
the first transistor has a lower gate capacitance than the second transistor, and the second transistor has a lower on-resistance than the first transistor, and
the third transistor has a lower gate capacitance than the fourth transistor, and the fourth transistor has a lower on-resistance than the third transistor.

46. The circuit of claim 41 wherein the controller block further comprises:
a first driver coupled to control the first transistor;
a second driver coupled to control the second transistor;
a third driver coupled to control the third transistor; and
a fourth driver coupled to control the fourth transistor.

47. A converter circuit comprising:
a first switch having first and second transistors parallel-connected between first and second terminals, the first terminal being coupled to an input source and the second terminal being coupled to an output load, the first transistor being smaller in size than the second transistor;
a second switch having third and fourth transistors parallel-connected between the output load and a reference source; and
a controller block coupled to maintain the first switch in an off-state and the second switch in an on-state during a first cycle and to maintain the first switch in an on-state and the second switch in an off-state during a second cycle, wherein during a transition from the first cycle to the second cycle, the controller block maintains the second transistor in the off state but turns the first transistor on so that a voltage level at the second terminal starts moving towards a predetermined voltage level at the first terminal, and when the voltage level at the second terminal reaches a voltage level substantially equal to the predetermined voltage level the controller block turns on the second transistor.

48. The converter circuit of claim 47 wherein the controller block turns off the first switch in a third cycle, and during a transition from the second cycle to the third cycle the controller block: (i) turns off the second transistor so that the first current is transferred to the second terminal only through the first transistor, and (ii) after a predetermined time-delay from turning off the second transistor, turns off the first transistor so that no current is transferred through the first switch.

49. The converter circuit of claim 47 wherein the first transistor has a lower gate capacitance than the second transistor, the second transistor has a lower on-resistance than the first transistor, the third transistor has a lower gate capacitance than the fourth transistor, and the fourth transistor has a lower on-resistance than the third transistor.

50. The converter circuit of claim 49 wherein during the transition from the first cycle to the second cycle the controller block turns off the second switch by: (i) turning off the fourth transistor, and (ii) after a predetermined time-delay from turning off the fourth transistor, turning off the third transistor so that no current is transferred through the second switch.

51. A method of operating a converter circuit having first and second serially-connected switches, the first switch including first and second transistors parallel-connected between first and second terminals, the first transistor being smaller in size than the second transistor, the method comprising:
in a first cycle, maintaining the first switch in an off-state and the second switch in an on-state;
in a second cycle, maintaining the first switch in an on-state and the second switch in an off-state;
during a transition from the first cycle to the second cycle:
turning on the first transistor so that a voltage level at the second terminal starts moving towards a predetermined voltage level at the first terminal; and
turning on the second transistor after the voltage level at the second terminal reaches a voltage level substantially equal to the predetermined voltage level.

52. The method of claim 51 wherein upon turning on the first transistor the first transistor transfers the first current from the first terminal to the second terminal, and in the act of turning on the second transistor the second transistor transfers a substantial portion of the first current from the first terminal to the second terminal for the duration of the second cycle.

53. The method of claim 51 further comprising:
turning off the first switch in a third cycle; and
during a transition from the second cycle to the third cycle:
turning off the second transistor so that the first current is transferred to the second terminal only through the first transistor; and
after a predetermined time-delay from turning off the second transistor, turning off the first transistor so that no current is transferred through the first switch.

54. The method of claim 51 wherein the first terminal is coupled to an input source and the second terminal is coupled to an output load, the second switch having third and fourth transistors parallel-connected between the output load and a reference source, the third transistor being smaller in size than the fourth transistor, the method further comprising:
during the transition from the first cycle to the second cycle:
turning off the fourth transistor; and
after a predetermined time-delay from turning off the fourth transistor, turning off the third transistor so that no current is transferred through the second switch.

55. The method of claim 54 wherein the first transistor has a lower gate capacitance than the second transistor, the second transistor has a lower on-resistance than the first transistor, the third transistor has a lower gate capacitance than the fourth transistor, and the fourth transistor has a lower on-resistance than the third transistor.

56. A circuit comprising:
a controller block; and
a first switch having first and second parallel-connected transistors coupled to supply a load current to a load under the control of the controller block, the second transistor having a lower on-resistance than the first transistor, wherein:
if the load current is greater than a predetermined amount the controller block turns on the first switch by sequentially turning on the first and second transistors so that the load current is initially supplied to the load only through the first transistor and after a predetermined time period a substantial amount of the load current is supplied to the load through the second transistor, and if the load current is less than the predetermined amount the controller block turns on the first switch by turning on the first transistor and maintaining the second transistor in the off state so that the load current is supplied to the load only through the first transistor.

57. The circuit of claim 56 further comprising a second switch serially-connected to the first switch, the controller block being coupled to control the first and second switches so that when the first switch is on the second switch is off and vice versa.

58. The circuit of claim 57 wherein the second switch comprises third and fourth parallel-connected transistors, the fourth transistor having a lower on-resistance than the third transistor, wherein the controller block turns on the second switch by turning on one or both of the third and fourth transistors depending on a magnitude of a current to be conducted through the second switch.

* * * * *